United States Patent [19]

Gries

[11] Patent Number: 5,250,390
[45] Date of Patent: Oct. 5, 1993

[54] LIGHT-CURABLE ELASTOMERIC MIXTURE AND RECORDING MATERIAL, OBTAINED THEREFROM FOR THE PRODUCTION OF RELIEF PRINTING PLATES

[75] Inventor: Willi-Kurt Gries, Wiesbaden, Fed. Rep. of Germany

[73] Assignee: Hoechst Aktiengesellschaft, Frankfurt am Main, Fed. Rep. of Germany

[21] Appl. No.: 772,855

[22] Filed: Oct. 8, 1991

[30] Foreign Application Priority Data

Oct. 11, 1990 [DE] Fed. Rep. of Germany ....... 4032238

[51] Int. Cl.$^5$ .................. G03F 7/033; G03F 7/028
[52] U.S. Cl. .................. 430/283; 430/271; 430/281; 430/286; 430/287; 430/306; 430/907; 430/910; 522/117; 522/121
[58] Field of Search ............. 430/306, 325, 286, 910, 430/907, 283, 281, 287, 271; 522/117, 121

[56] References Cited

U.S. PATENT DOCUMENTS

| | | | |
|---|---|---|---|
| 4,042,386 | 8/1977 | Okai et al. | 430/281 |
| 4,272,608 | 6/1981 | Proskow | 430/288 |
| 4,275,142 | 6/1981 | Hosaka et al. | 522/121 |
| 4,446,220 | 5/1984 | Proskow | 430/286 |
| 4,517,279 | 5/1985 | Worns | 430/286 |
| 4,554,240 | 11/1985 | Schulz et al. | 430/285 |
| 4,849,307 | 7/1989 | Hoffmann et al. | 430/271 |
| 4,927,738 | 5/1990 | Iwanaga et al. | 430/286 |
| 5,034,306 | 7/1991 | Gersdorf et al. | 430/284 |
| 5,073,477 | 12/1991 | Kusuda et al. | 430/907 |

FOREIGN PATENT DOCUMENTS

| | | |
|---|---|---|
| 130828 | 1/1985 | European Pat. Off. |
| 183552 | 6/1986 | European Pat. Off. |
| 251228 | 1/1988 | European Pat. Off. |
| 261910 | 3/1988 | European Pat. Off. |
| 273393 | 7/1988 | European Pat. Off. |
| 277418 | 8/1988 | European Pat. Off. |
| 0298667 | 1/1989 | European Pat. Off. |
| 351628 | 7/1989 | European Pat. Off. |
| 80/0506 | 1/1980 | South Africa . |
| 1366769 | 9/1974 | United Kingdom . |
| 2179360 | 3/1987 | United Kingdom . |

Primary Examiner—Marion E. McCamish
Assistant Examiner—Janis L. Dote
Attorney, Agent, or Firm—Foley & Lardner

[57] ABSTRACT

A light-curable elastomeric mixture is described, containing a) an elastomeric binder or binder mixture,
b) a low molecular-weight compound which is polymerizable by a free-radical mechanism, is compatible with said binder or binder mixture, has at least one ethylenically unsaturated end group and has a boiling point above 100° C. at normal pressure, and
c) a compound or combination of compounds which is capable of initiating the polymerization of compound (b) under the action of actinic light, wherein said elastomeric binder is a block copolymer, soluble or dispersible in water or in an aqueous solution, having a structure selected from the group consisting of A—B, B—A—B, C—A—B, C—A—C—B, B—C—A—C—B, $A_nXB_n$, $(A—B)_xX$, $C_nX(A—B)_n$, $(C—A)_nXB_n$, $(C—A—B)_nX$, $C_nX(A—C—B)_n$, $(C—A)_nX(C—B)_n$, $(C—A—C)_nXB_n$, $(C—A—C—B)_nX$, $B_nXA_nXB_n$, $X(B—A—B)_nX$, $(B—C)_nXA_nX(C—B)_n$, $B_nX(C—A—C)_nXB_n$ and $X(B—C—A—C—B)_nX$, in which A designates hydrophobic soft blocks having $T_g < -30°$ C.,
B designates hydrophilic rigid blocks comprising at least one acid groups and having $T_g > +30°$ C.,
C designates hydrophobic rigid blocks having $T_g > +50°$ C.,
X is a unit formed from a compound having at least two vinyl or isopropenyl groups or a homopolymer block formed from such compounds, and
n is the numerical ratio of A and/or B and/or C homopolymer blocks relative to the unit X or to the homopolymer block X.

The photocurable elastomeric mixtures are suited particularly well for the production of elastic relief printing plates.

13 Claims, No Drawings

LIGHT-CURABLE ELASTOMERIC MIXTURE AND RECORDING MATERIAL, OBTAINED THEREFROM FOR THE PRODUCTION OF RELIEF PRINTING PLATES

BACKGROUND OF THE INVENTION

The invention relates to a light-curable, negative-working mixture and to a recording material which is obtainable therefrom and which is suitable for producing elastic relief printing plates.

Light-curable elastomeric mixtures are known and usually contain an elastomeric binder, a compound polymerizable by a free-radical mechanism and a polymerization initiator which can be activated by actinic radiation. Printing plates having a light-sensitive layer composed of such a mixture are described, for example, in DE-A 2,215,090 (=GB-A 1,366,769). However, they can be developed after exposure, to give the relief image, only by means of organic solvents.

In Patent Publications DE-A 3,003,011 (=ZA 80/506), EP-A 0,130,828, DE-A 2,725,730 (=U.S. Pat. No. 4,042,386) and DE-A 3,322,994 (=U.S. Pat. No. 4,554,240), recording materials which can be developed in an aqueous medium and which contain water soluble polymers as binders, in particular partially or completely saponified polyvinyl acetates, are admittedly disclosed. However, the water resistance of the relief printing plates produced from them is low, so that they cannot be used with water-dilutable printing inks.

The light-sensitive mixtures according to DE-A 3,012,841 (=U.S. Pat. No. 4,272,608) contain, as binders, carboxylated butadiene/acrylonitrile copolymers in which at least 25% of the carboxyl groups are neutralized with a metal cation from groups IIA or IIB of the periodic table.

Butadiene/styrene, isoprene/styrene and butadiene/acrylonitrile copolymers modified by reaction with 3-mercaptopropionic acid and thus containing carboxyl groups, and similarly modified polybutadienes and polyisoprenes, are disclosed in U.S. Pat. No. 4,446,220 as binders in light-sensitive compositions.

Rubber-elastic copolymers, which contain carboxyl groups and are formed by copolymerization of 1,3-butadiene with (meth)acrylic acid, an ethylenically polyunsaturated compound, such as ethylene glycol dimethacrylate or divinylbenzene, and an ethylenically monounsaturated compound, such as ethyl acrylate, are described in EP-A 0,277 418 and 0,261,910. Said copolymers are used as binders in light-sensitive compositions.

A light-sensitive elastomeric composition, which contains a high molecular-weight carboxylated butadiene/acrylonitrile copolymer as binder, for flexographic printing planes is described in U.S. Pat. No. 4,517,279.

The composition disclosed in GB-A 2,179,360 contains, in addition to the carboxylated butadiene/acrylonitrile copolymer, also a chlorosulfonated polyethylene, and it can likewise be developed with an aqueous developer.

According to EP-A 0,183,552, 1,3-butadiene/methacrylic acid, 1,3-butadiene/methacrylic acid/acrylonitrile or butadiene/methacrylic acid/styrene copolymers are used as binders which contain carboxyl groups.

The light-sensitive composition according to EP-A 0,251,228 contains a rubber elastic binder having a glass temperature lower than $-0°$ C. Copolymers containing carboxyl groups, such as 1,3-butadiene/(meth)acrylic acid/acrylate copolymers are also mentioned as examples of such a binder. The flexographic printing plates produced using this composition are developable in water.

In EP-A 0,273,393, chlorine-containing polymers having a glass temperature lower than $+5°$ C. are described as binders in light-sensitive compositions for flexographic printing plates.

If the carboxyl group content in the polymeric binders is too low, the flexographic layer can be developed with aqueous developers only with difficulty. In these cases, it is necessary to add to the light-sensitive composition polar monomers or auxiliaries in a large amount, which in turn entail a high cold flow of the unexposed material. "Cold flow" is used as the description of plastic flow over a prolonged period due to the intrinsic weight of the material, internal strains in the material or external stresses. Although an increase in the carboxyl group content results in an improved aqueous developability, the rubber-elastic properties deteriorate at the same time and, furthermore, the resistance to water-containing printing inks is reduced.

SUMMARY OF THE INVENTION

Accordingly, it is an object of the present invention to provide light-sensitive, elastomeric mixtures which produce light-sensitive layers without the existing disadvantages for the production of relief printing plates Another object of the present invention is to provide elastomeric mixtures which produce light-sensitive layers that, upon exposure, are developable in aqueous media under mild conditions and, in addition, show a high resistance to water-dilutable printing inks.

A further object of the present invention is to provide a light-curable recording material including the foregoing light-sensitive layer.

In accomplishing the foregoing objectives, there has been provided, in accordance with one aspect of the present invention, a light-curable elastomeric mixture comprising (a) an elastomeric binder or binder mixture,
(b) a low molecular-weight compound which is polymerizable by a free-radical mechanism, is compatible with said binder or binder mixture, has at least one ethylenically unsaturated end group and has a boiling point above 100° C. at normal pressure, and
(c) a compound or combination of compounds which is capable of initiating the polymerization of compound (b) under the action of actinic light, wherein said elastomeric binder is a block copolymer, soluble or dispersible in water or in an aqueous solution, having a structure selected from the group consisting of A—B, B—A—B, C—A—B, C—A—C—B, B—C—A—C—B, $A_nXB_n$, $(A-B)_xX$, $C_nX(A-B)_n$, $(C-A)_nXB_n$, $(C-A-B)_nX$, $C_nX(A-C-B)_n$, $(C-A)_nX(C-B)_n$, $(C-A-C)_nXB_n$, $(C-A-C-B)_nX$, $B_nXA_nXB_n$, $X(B-A-B)_nX$, $(B-C)_nXA_nX-(C-B)_n$, $B_nX(C-A-C)_nXB_n$ and $X(B-C-A-C-B)_nX$, in which A designates hydrophobic soft blocks having $T_g < -30°$ C.,
B designates hydrophilic rigid blocks comprising at least one acid groups and having $T_g > +30°$ C.,
C designates hydrophobic rigid blocks having $T_g > +50°$ C., X is a unit formed from a compound having at least two vinyl or isopropenyl groups or a homopolymer block formed from such compounds, n is the numerical ratio of A and/or B and/or C homopolymer blocks relative to the unit X or to the homopolymer block X.

In accordance with another aspect of the present invention there is provided a light-curable recording material comprising a layer support and a light-curable layer, wherein the light-curable layer comprises a light-curable mixture as defined above.

Other objects, features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

The objects of the invention are surprisingly achieved by the use of amphiphilic elastomeric block copolymers as binders. Those block copolymers are here termed "amphiphilic" block copolymers which contain both water-attracting (hydrophilic) and water-repellent (hydrophobic) sections and therefore have a surfactant character.

The degree of surface activity can be adjusted in a simple manner by suitable choice of the pH: at high pH, a major part of the acidic, e.g., carboxyl, groups is in the deprotonated form, which results in a higher polarity and correspondingly a more pronounced surface activity.

The mixture according to the invention contains, as the binder, an amphophilic elastomeric block copolymer, soluble or at least dispersible in an aqueous solution, of the general structure A—B, C—A—B, C—A—C—B, $A_nXB_n$, $(A—B)_xX$, $C_nX(A—B)_n$, $(C—A)_nXB_n$, $(C—A—B)_nX$, $C_nX(A—C—B)_n$, $(C—A)_nX(C—B)_n$, $(C—A—C)_nXB_n$ and $(C—A—C—B)_nX$. Symmetrical B—A—B and B—C—A—C—B block copolymers and branched representatives corresponding to $X(B—A—B)_nX$, $B_nXA_nXB_n$, $X(B—C—A—A—C—B)_nX$, $(B—C)_nXA_nX(C—B)_n$ and $B_nX(C—A—C)_nXB_n$ can also be used as binders. In these block copolymers, A designates hydrophobic soft blocks having $T_g < -30°$ C., B represents hydrophilic rigid blocks containing acid groups, preferably carboxyl groups, and having a glass temperature $T_g$ above $+30°$ C., C represents hydrophobic rigid blocks having $T_g > +50°$ C., X is a unit formed from a compound having two or more vinyl or isopropenyl groups or a homopolymer block formed from such compounds and as a rule being branched or crosslinked, and n is the numerical ratio of A and/or B and/or C homopolymer blocks relative to the unit X or to the homopolymer block X.

Suitable monomers for the block polymers A are conjugated dienes such as 1,3-butadiene, isoprene, 2,3-dimethyl-1,3-butadiene, 1,3-pentadiene, 2-methyl-3-ethyl-1,3-butadiene, 3-methyl-1,3-pentadiene, 2-methyl-3-ethyl-1,3-pentadiene, 2-ethyl-1,3-pentadiene, 1,3-hexadiene, 2-methyl-1,3-hexadiene, 1,3-heptadiene, 1,3-octadiene, 3,4-dimethyl-1,3-hexadiene and 2-phenyl-1,3-butadiene. The use of mixtures of suitable dienes or the use of other anionically polymerizable conjugated dienes having 4 to 12 carbon atoms is also possible. Isoprene and 1,3-butadiene are preferred.

The block polymers B result preferably from $\alpha,\beta$-ethylenically unsaturated carboxylic acids such as maleic acid, fumaric acid, itaconic acid, acrylic acid, methacrylic acid and crotonic acid. Other carboxylic acids having vinyl units of reduced electron density, such as, for example, vinylbenzoic acid, can also be used as starting materials.

Suitable starting materials for block polymers C are vinylaromatic compounds, especially styrene, alkylstyrene or vinylnaphthalene, styrene being particularly preferred.

The units or blocks X are introduced by reacting the anionic chain end members with compounds containing at least two vinyl or isopropenyl groups. Advantageously, di- and tri-vinylbenzene or compounds having at least two methacryloyloxy groups are used. 1,4-Divinylbenzene, 1,3-diisopropenylbenzene, ethylene glycol dimethacrylate and trimethylolpropane trimethacrylate are particularly preferred.

Detailed data regarding the block copolymers as such and regarding processes for the preparation thereof are to be found in German Patent Application P 40 32 237.8.

The molecular weights determined by gel permeation chromatography (GPC) are in the range from about 2,000 g/mol to 2,000,000 g/mol, preferably from about 15,000 g/mol to 200,000 g/mol. The mass fractions of the block components involved vary from about 20 to 99% for A, about 1 to 30% for B and 0 to about 79% for C.

The light-sensitive mixtures according to the invention contain in general about 20 to 95% by weight, preferably about 30 to 90% by weight, of the amphiphilic binder, either exclusively or in conjunction with other polymeric materials. Such polymeric materials can be chlorinated or chlorosulfonated polyethylene compounds, diene polymers or copolymers of random or segmented structure, and suitable thermoplastic elastomers which can be prepared by polyaddition or polycondensation. Moreover, they contain at least one olefinically unsaturated compound polymerizable by a free-radical mechanism, and at least one photoinitiator.

Suitable monomers having one or more polymerizable olefinic double bonds are especially esters and amides of acrylic, methacrylic, fumaric and maleic acid, and mixtures of these compounds. In addition, the alcohols or amines required for the ester or amide formation can contain further functional groups such as, for example, ether units, hydroxyl groups or primary, secondary or tertiary amino groups. Examples of alcohols suitable for forming esters are open-chain and cyclic alkanols, such as butanol, hexanol, octanol, decanol, dodecanol, octadecanol, 2-ethylhexanol, cyclohexanol or borneol, and also hydroxylated oligo- or poly-butadienes and hydroxylated oligo- or poly-isoprenes. Further suitable alcohols are alkanediols, polyfunctional alcohols and similar compounds, for example 1,4-butanediol or 1,6-hexanediol, (poly)ethylene glycol or (poly)propylene glycol, glycerol, trimethylolpropane, butanetriol, pentaerythritol and others. The di- or polyfunctional alcohols can be esterified partially or completely. Further examples of unsaturated compounds are specific esters and amides of (meth)acrylic acid, such as, for example, dimethylaminoethyl (meth)acrylate, dimethyl-aminopropyl-(meth)acrylamide, 2-butylaminoethyl (meth)acrylate, ethylene-bis-(meth)acrylamide, hexamethylene-bis-(meth)acrylamide, diethylenetriamine-tris-(meth)acrylamide, hydroxymethyl-(meth)acrylamide and bis-hydroxyethyl-(meth)acrylamide. The quantity of monomers is in general about 5 to 70% by weight, preferably about 10 to 50% by weight, of the non-volatile constituents of the mixture.

The photoinitiators used for the mixtures according to the invention can be the known compounds which have an adequate thermal stability during the processing of the recording materials and an adequate formation of free radicals on exposure for initiating the polymerization of the monomers. They should absorb light in the wavelength region from about 250 nm to 500 nm to form free radicals. Examples of suitable photoinitiators are acyloins and derivatives thereof, such as benzoin and benzoin alkyl ethers, 1,2-diketones and derivatives thereof, for example benzil and benzil acetals such as benzil dimethyl ketal, fluorenones, thioxanthones, polynuclear quinones, acridines and quinoxalines, and also trichloromethyl-s-triazines, 2-halogenomethyl-4-vinyl[1,3,4]oxadiazole, halogeno-oxazoles substituted by trichloromethyl groups, carbonylmethylene heterocyclic compounds containing trihalogenomethyl groups according to DE-A 3,333,450, acylphosphine oxide compounds such as are described, for example, in DE-A 3,133,419, and other phosphorus-containing photoinitiators, for example the 6-acyl-6H-dibenzo-[c,e][1,2]oxaphosphorine 6-oxides described in DE-A 3,728,168, especially 6-(2,4,6-trimethylbenzoyl)-6H-dibenzo[c,e][1,2]oxaphosphorine 6-oxide. The photoinitiators can also be used in combination with one another or with co-initiators or activators, for example with Michler's ketone and derivatives thereof, or with 2-alkyl-anthraquinones. The quantity of photoinitiator is in general about 0.01 to 10% by weight, preferably about 0.5 to 5% by weight, of the light-sensitive layer.

It is frequently of advantage to add yet further auxiliaries and additives to the recording material, for example those which inhibit the thermal polymerization, such as hydroquinone and derivatives thereof, 2,6-di-tert.-butyl-p-cresol, nitrophenols, nitrosamines such as N-nitrosodiphenylamine, or salts of N-nitrosocyclohexylhydroxylamine, for example alkali metal salts or aluminum salts thereof. Further conventional additives are dyes, pigments, processing aids and plasticizers.

For the production of relief printing plates and flexographic printing plates, the mixtures according to the invention can be processed by coating from solution or by extrusion and calendaring, to give layers of a thickness from 0.02 to 6 mm, preferably from 0.2 to 3 mm. The layer can be laminated to the surface of a suitable support, or a solution of the mixtures according to the invention can be applied directly to a layer support.

In addition to the production of relief printing plates, the mixtures according to the invention can also be used, for example, for producing planographic printing plates, gravure printing cylinders, screen printing stencils and photoresists.

Examples of suitable supports are, depending on the intended use, polyester films, steel or aluminum sheets, copper cylinders, screen printing stencil supports, foam layers, rubber-elastic supports or circuit boards. It can also be advantageous to apply a covering layer or protective layer, for example a thin layer of polyvinyl alcohol or polyamide, or a cover film which can be peeled off, for example of polyethylene terephthalate, to the light-sensitive recording layer. Moreover, precoating of the support may be advantageous. The additional layer between the support and the light-sensitive layer can, for example, be active as an antihalo layer or adhesion-promoting layer.

The recording materials according to the invention can be exposed imagewise with actinic light from light sources such as mercury vapor lamps or fluorescent tubes, the emitted wavelength being preferably between about 300 and 420 nm. The removal of the unexposed and uncrosslinked layer areas can be effected by spraying, washing or brushing with water or basic aqueous solutions. Examples of basic materials which can be used are hydroxides, carbonates or hydrogen carbonates of the alkali metals, ammonia and organic amines. Wetting agents and emulsifiers and also water-miscible organic solvents such as, for example, aliphatic alcohols, ethylene glycols and ethylene glycol monoethers can also be added. The content of the basic components in the solution is in general about 0.01 to 5% by weight, preferably about 0.1 to 1% by weight. The content of organic solvent is less than about 40% by weight, preferably less than about 20% by weight.

Alternatively, organic solvents such as aromatic hydrocarbons, chloroalkanes and ketones can also be used as the developer. Examples of these are toluene, xylene, 1,1,1-trichloroethane, tetrachloroethylene, methyl isobutyl ketone and others, which can also be used in combination with lower alcohols, for example n-butanol. Advantageously, the developed relief forms are dried at temperatures up to 120° C. and, if appropriate, photochemically or chemically post-treated.

The recording materials according to the invention are particularly suitable for producing printing forms, above all letterpress or relief printing forms, which are particularly suitable for flexographic printing.

The invention is explained by the examples which follow. Unless otherwise stated, % data are in % by weight.

PREPARATION EXAMPLE 1.33 ml of 1.6 M n-BuLi solution in hexane are added to a mixture of 40 ml of toluene and 80.6 mmol of styrene under an inert gas atmosphere in a dry glass autoclave or glass apparatus. The reaction mixture, while warming up, is stirred for 2 hours in a water bath, diluted with 160 ml of toluene and, after the addition of 500 mmol of isoprene, stirred for a further 2.5 hours. 3.80 mmol of 1,1-diphenylethene and 200 ml of THF are added to the viscous reaction solution. This is then cooled with an NaCl/ice water mixture. After the addition of 99.6 mmol of t-butyl methacrylate, stirring is continued for 1 hour in a cooled bath, and the polymerization is stopped with 1 ml of methanol. The reaction solution is then introduced in fine distribution into 10 times the volume of methanol. The polymer precipitated is filtered off with suction, washed and dried. To remove the t-butyl protective group, the isolated material is dissolved in toluene, treated with 5% by weight of p-toluenesulfonic acid, relative to t-butyl methacrylate, and heated for 6 hours at 80° C. After cooling, the product is precipitated with MeOH, washed and dried in vacuo at room temperature.

Yield: 97% (83%); M (GPC) 49,000 (before elimination of the tert.-butyl protective group); acid number: 68.0 mg of KOH/g

EXAMPLE 1

37.0 g of an S-I-MAA block copolymer, synthesized according to the preparation example, with 19% of styrene, 7% of isoprene and 10% of methacrylic acid, 37.0 g of an S-I-S block copolymer (®Europren Sol T 190), 16.0 g of liquid polyisoprene (®Kuraray LIR 403), 8.5 g of trimethylolpropane triacrylate, 1.0 g of benzil dimethyl ketal and 0.5 g of 2,6-di-tert.-butyl-4-methyl-phenol are dissolved in 300 g of toluene and then poured into a drying frame. The light-sensitive layer obtained after evaporation of the solvent is pressed in a plate press between two 0.125 mm thick polyester films, one of which is provided with an adhesion layer and the other with an anti-tack layer, to a layer thickness of 3.0 mm. After exposure for 20 seconds from the back, it is exposed imagewise in a UVA flat exposure apparatus for 8 minutes and then treated for 20 minutes at 60° C. with a developer composed of 15 parts of diethylene glycol monobutyl ether and 85 parts of 1% aqueous sodium hydroxide solution. The exposed plate has a Shore A hardness of 30 and gives in water, in ethanol or in a mixture of 85 parts of ethanol and 15 parts of ethyl acetate a swelling value of 0.3%, 1.4% or 5.2% respectively.

EXAMPLES 2 to 9

Analogously to Example 1, further photopolymer printing plates having the compositions described in Table 1 are prepared and, after exposure, developed according to Example 1. The respective values of hardness and swelling are compiled in Table 2.

TABLE 2

Swelling* and hardness values of the photopolymer mixtures

| Example | $H_2O$ | EtOH | EtOH/EtOAc (85/15) | Hardness after 30 seconds |
|---|---|---|---|---|
| 2 | 0.25% | 1.7% | 5.9% | 43 Shore A |
| 3 | 0.20% | 0.46% | 5.6% | 43 Shore A |
| 4 | 0.65% | 0.67% | 4.7% | 43 Shore A |
| 5 | 0.88% | 0.79% | 3.8% | 38 Shore A |
| 6 | 3.9% | 17% | 30% | 56 Shore A |
| 7 | 1.1% | 2.9% | 7.9% | 53 Shore A |
| 8 | 0.80% | 2.5% | 7.2% | 31 Shore A |
| 9 | 2.8% | 3.9% | 9.5% | 25 Shore A |

*Calculated according to swelling = $(m_{24h} - m_0)/m_0 \times 100$

EXAMPLE 10

A mixture composed of 80.0 g of an S-I-S block copolymer ®Europran Sol T 190)

80.0 g of an $(S-I)_n X(MAA)_n$ block copolymer (S=9.2%, I=79%, MAA=9.8%, X=divinylbenzene=2.1%, $M_p$=225,000), 17.0 g of trimethylolpropane triacrylate, 20.0 g of nonaethylene glycol dimethacrylate, 2.0 g of benzil dimethyl ketal and 1.0 g of 2,6-di-tert.-butyl-hydroxytoluene is kneaded on a two-roll mill at 150° C. until a homogeneous, clear mass is formed. This light-sensitive mass is then pressed in a plate press at 120° C. between two 0.125 mm thick polyester films, (one thereof being provided with an adhesion layer and the other being provided with an anti-tack layer), to a layer thickness of 3.0 mm. After exposure for 20 seconds from the rear, the layer is exposed imagewise for 8 minutes, treated for 10 minutes at 60° C. with the developer described in Example and the dried for 24 hours at room temperature. The exposed printing plate has a Shore A hardness of 53 and gives, in water, in ethanol or in a mixture of 85 parts of ethanol and 15 parts of ethyl acetate, a swelling value of 0.39%, 4.72% or 14.2% respectively.

Appendix to Tables

1) I=isoprene, MAA=methacrylic acid, S=styrene

TABLE 1

| Components[1],[2] | Photopolymer mixtures | | | | | | | |
|---|---|---|---|---|---|---|---|---|
| | 2 | 3 | 4 | 5 | 6 | 7 | 8 | 9 |
| S-I-MAA (10%-80%-10%); $M_p$ = 142,000 | 37% | — | — | — | — | — | — | — |
| S-I-MAA (20%-70%-10%); $M_p$ = 59,000 | — | 37% | — | — | — | — | — | — |
| S-I-MAA (10%-75%-15%); $M_p$ = 52,000 | — | — | 9.0% | — | — | — | — | — |
| S-I-MAA (10%-75%-15%); $M_p$ = 56,000 | — | — | 36% | — | — | — | — | — |
| S-I-MAA (10%-80%-10%); $M_p$ = 94,000 | — | — | — | 48% | — | — | — | — |
| S-I-MAA (20%-70%-10%); $M_p$ = 126,000 | — | — | — | — | 74% | 37% | 56% | — |
| I-MAA (90%-10%) $M_p$ = 83,000 | — | — | — | — | — | — | — | 40% |
| S-I-S block copolymer[a] | 37% | 37% | 30% | — | — | 37% | 18% | — |
| Chlorosulfonated polyethylene[b] | — | — | — | 32% | — | — | — | — |
| S-I-S block copolymer[c] | — | — | — | — | — | — | — | 35% |
| liquid polyisoprene[d] | 16% | 16% | — | — | 16% | 16% | 16% | — |
| liquid epoxidized polybutadiene[e] | — | — | — | — | — | — | — | 12% |
| Trimethylolpropane triacrylate | 8.5% | 8.5% | 3.5% | 8.5% | 8.5% | 8.5% | 8.5% | — |
| Tripropylene glycol diacrylate | — | — | 5.0% | — | — | — | — | — |
| 2,3-Glycerol dimethacrylate | — | — | 10% | — | — | — | — | — |
| Polyethylene glycol-400 dimethacrylate | — | — | — | 5.0% | — | — | — | 4.0% |
| Dimethylaminoethyl methacrylate | — | — | — | 5.0% | — | — | — | — |
| Pentaerythritol triacrylate | — | — | — | — | — | — | — | 8.0% |
| Benzil dimethyl ketal | 1.0% | 1.0% | 1.0% | 1.0% | 1.0% | 1.0% | 1.0% | 1.0% |
| 2,6-di-tert.-Butyl-4-methyl-phenol | 0.5% | 0.5% | 0.5% | 0.5% | 0.5% | 0.5% | 0.5% | 0.5% |
| Triethanolamine | — | — | 5.0% | — | — | — | — | — |

[a] ®EUROPENE Sol T 190 (EniChem Elastomeri SpA)
[b] ®HYPALON 40 (E. I. du Pont de Nemours & Co.)
[c] ®CARIFLEX TR 1107 (Shell Elastomers)
[d] ®KURARAY LIR (Kuraray Isoprene Chemicals Co. Ltd.)
[e] ®POLYVEST OE 29 (Hüls Aktiengesellschaft)

2) M = mean molecular weight (peak maximum of the GPC curve) determined by GPC measurement with THF as solvent and polyisoprene as standard (material before elimination of the protective groups).

What is claimed is:

1. A light-curable elastomeric mixture comprising
   a) an elastomeric binder or binder mixture,
   b) a low molecular-weight compound which is polymerizable by a free-radical mechanism, is compatible with said binder or binder mixture, has at least one ethylenically unsaturated end group and has a boiling point above 100° C. at normal pressure, and
   c) a compound or combination of compounds which is capable of initiating the polymerization of compound (b) under the action of actinic light, wherein said elastomeric binder is a block copolymer, soluble or dispersible in water or in an aqueous solution, having a structure selected from the group consisting of A—B, B—A—B, C—A—B, C—A—C—B, B—C—A—C—B, $A_nXB_n$, $(A—B)_xX$, $C_nX(A—B)_n$, $(C—A)_nXB_n$, $(C—A—B)_nX$, $C_nX(A—C—B)_n$, $(C—A)_nX(C—B)_n$, $(C—A—C)_nXB_n$, $(C—A—C—B)_nX$, $B_nXA_nXB_n$, $X(B—A—B)_nX$, $(B—C)_nXA_nX(C—B)_n$, $B_nX(C—A—C)_nXB_n$ and $X(B—C—A—C—B)_nX$, in which A designates hydrophobic soft blocks having $T_g < -30°$ C., B designates hydrophilic rigid blocks comprising at least one acid groups and having $T_g > +30°$ C., C designates hydrophobic rigid blocks having $T_g > +50°$ C., X is a unit formed from a compound having at least two vinyl or isopropenyl groups or a homopolymer block formed from such compounds, and n is the numerical ratio of A and/or B and/or C homopolymer blocks relative to the unit X or to the homopolymer block X.

2. A light-curable elastomeric mixture as claimed in claim 1, wherein said elastomeric block copolymer used as the binder comprises about 20 to 99% by weight of polymer blocks A, about 1 to 30% by weight of polymer blocks B and 0 to about 79% by weight of polymer blocks C.

3. A light-curable elastomeric mixture as claimed in claim wherein, in said elastomeric block copolymer used as binder, said soft polymer blocks A are formed from conjugated dienes, said rigid polymer blocks B are formed from ethylenically $\alpha,\beta$-unsaturated carboxylic acids and said polymer blocks C are formed from vinylaromatic compounds.

4. A light-curable elastomeric mixture as claimed in claim 3, wherein said conjugated diene is 1,3-butadiene, isoprene or 2,3-dimethyl-1,3-butadiene.

5. A light-curable elastomeric mixture as claimed in claim 3, wherein said ethylenically $\alpha,\beta$-unsaturated carboxylic acid is acrylic acid or methacrylic acid.

6. A light-curable elastomeric mixture as claimed in claim 3, wherein said vinylaromatic compound is styrene or vinylnaphthalene.

7. A light-curable elastomeric mixture as claimed in claim wherein X is branched or crosslinked.

8. A light-curable elastomeric mixture as claimed in claim I, wherein said elastomeric block copolymer used as the binder has a molecular weight from about 15,000 to 200,000 g/mol.

9. A light-curable elastomeric mixture as claimed in claim 1, wherein said compound polymerizable by a free-radical mechanism is an ester produced by reacting an acid selected from the group consisting of acrylic acid, methacrylic acid, fumaric acid and maleic acid with a monohydric or polyhydric alcohol, or an amide produced by reacting an acid selected from the group consisting of acrylic acid, methacrylic acid, fumaric acid and maleic acid with an amine.

10. A light-curable elastomeric mixture as claimed in claim I, which comprises about 20 to 95% by weight of said elastomeric block copolymer (a), about 5 to 70% by weight of said polymerizable compound (b) and about 0.01 to 10% by weight of said photopolymerization initiator (c).

11. A light-curable elastomeric mixture as claimed in claim 1, consisting essentially of the recited ingredients.

12. A light-curable recording material consisting essentially of a layer support and a light-curable layer, wherein said light-curable layer consists essentially of a mixture as claimed in claim 11.

13. A light-curable recording material comprising a layer support and a light-curable layer, wherein said light-curable layer comprises a mixture as claimed in claim 1.

* * * * *